United States Patent [19]

Marohl et al.

[11] Patent Number: 5,860,640
[45] Date of Patent: Jan. 19, 1999

[54] SEMICONDUCTOR WAFER ALIGNMENT MEMBER AND CLAMP RING

[75] Inventors: Dan A. Marohl, San Jose; Michael Rosenstein, Sunnyvale, both of Calif.

[73] Assignee: Applied Materials, Inc., Santa Clara, Calif.

[21] Appl. No.: 564,398

[22] Filed: Nov. 29, 1995

[51] Int. Cl.$^6$ .................................................. B23Q 03/00
[52] U.S. Cl. ...................... 269/289 R; 118/729; 414/935
[58] Field of Search ............................. 29/25.01; 269/21, 269/289 R, 903; 204/298.15; 148/DIG. 162; 414/627, 783, 935, 936, 939, 940, 941; 118/729; 156/345 PW, 345 WH

[56] References Cited

U.S. PATENT DOCUMENTS

| | | | |
|---|---|---|---|
| 4,457,661 | 7/1984 | Flint et al. | 414/404 |
| 5,000,113 | 3/1991 | Wang et al. | 118/723 |
| 5,037,262 | 8/1991 | Moll et al | 269/903 X |
| 5,228,501 | 7/1993 | Tepman et al. | 165/80.1 |
| 5,292,399 | 3/1994 | Lee et al. | 156/345 X |
| 5,316,278 | 5/1994 | Sherstinsky et al. | 269/254 R |
| 5,326,725 | 7/1994 | Sherstinsky et al. | 437/225 |
| 5,328,722 | 7/1994 | Ghanayem et al. | 118/729 X |
| 5,352,294 | 10/1994 | White et al. | 118/729 X |
| 5,516,367 | 5/1996 | Lei et al. | 118/725 |

FOREIGN PATENT DOCUMENTS

| | | |
|---|---|---|
| 0 343 502 A2 | 11/1989 | European Pat. Off. . |
| 0 343 502 A3 | 11/1989 | European Pat. Off. . |
| 0 392 516 A2 | 10/1990 | European Pat. Off. . |
| 0 392 516 A3 | 10/1990 | European Pat. Off. . |
| 0 462 563 A1 | 12/1991 | European Pat. Off. . |
| 0 595 307 A2 | 5/1994 | European Pat. Off. . |
| 0 595 307 A3 | 5/1994 | European Pat. Off. . |

OTHER PUBLICATIONS

IBM Technical Disclosure Bulletin, Self–Aligning, Low Adhesion Clamp–Ring Assembly, Dec. 1988, No. 7, two pages.
European Search Report –Application No. 93 11 744.
European Search Report –Application No. EP 89 10 8902.
European Search Report –Application No. EP 90 10 6959.
European Search Report –Application No. 91 10 9954.

*Primary Examiner*—Janice L. Krizek
*Attorney, Agent, or Firm*—Patterson & Associates

[57] ABSTRACT

A semiconductor processing chamber includes a substrate support member on which a substrate and a clamp ring are aligned during processing in the chamber. To align the substrate on the support member, a frustoconical substrate alignment member extends about the perimeter of the substrate receiving surface of the support member to capture a substrate received in the chamber and center the substrate on the upper surface of the support member. The alignment member includes an alignment face thereon, which urges a substrate into alignment with the substrate receiving face of the support member as the substrate is deposited on the support member. To clamp the substrate in proper alignment on the support member and flatten any warpage in the substrate, a clamp ring alignment member is provided which aligns and supports a clamp ring on a substrate without causing significant shadowing of the substrate. The clamp ring is vertically and laterally aligned relative to the support member and substrate centered thereon. The clamp ring alignment member is preferably a plurality of adjustable alignment pins positioned in the outer perimeter of the support member.

33 Claims, 8 Drawing Sheets

SEMICONDUCTOR WAFER ALIGNMENT MEMBER AND CLAMP RING

FIELD OF THE INVENTION

The present invention relates to the field of semiconductor substrate processing equipment. More particularly, the present invention relates to a method and apparatus for aligning and flattening a substrate on a substrate support member.

BACKGROUND OF THE ART

The fabrication of semiconductor devices on substrates typically requires the deposition of multiple metal, dielectric and semiconductor film layers on the surface of a substrate. The film layers are typically deposited onto the substrates in vacuum chambers. Certain processing operations require the deposition of film layers or the etching of a previously deposited film layer. During these processing steps, one must properly align and secure the substrate in the processing chamber in which the desired deposition or etch process is performed.

Typically, the substrate is supported in the chamber on a support member, commonly called a susceptor or pedestal. The substrate is placed on, and secured to, the upper surface of the support member prior to the deposition or etch process. In one process, metal may be deposited onto the backside of the substrate following processing of the front side of the substrate. During this type of processing, the substrate is supported on rest buttons which extend from the upper surface of the support member to reduce the surface area contact between the substrate and the support member. The rest buttons are sized and positioned to locate the substrate at a desired location in the chamber. To ensure proper processing of the substrate, the substrate must be properly aligned relative to the support member and a generally planar surface must be presented for receipt of a deposition layer. The position of the support member in the chamber is selected to provide a desired spacing and relative geometry between the generally planar surface of the substrate and portions of the process chamber. In a sputter deposition process, the position and alignment of the substrate is selected to present a planar surface of the substrate co-planar to the planar target surface and at a distance from the target which is selected to provide uniform thickness deposition on the substrate.

Substrates on which film layers are deposited may be extremely thin. Thin substrates tend to warp or take on a "potato chip" profile. When the substrate warps, it no longer presents a generally planar surface to receive deposition material. The warped surface of the substrate results in a non-co-planar relationship between the substrate and the target, and variable spacing therebetween. Consequently, in applications where substrates have become bowed, the substrates must be flattened before they are exposed to the deposition environment. Otherwise, nonuniform thickness deposition of the film layer may result.

Typically, a clamp ring is used to flatten warped substrates and secure substrates to the support member. However, care must be exercised when securing a substrate so that the substrate is not damaged by the clamp ring. Clamp rings must be positioned both laterally and vertically relative to the substrate to ensure that the substrates are not damaged under the weight of the clamp ring or by contact between a misaligned substrate and a clamp ring as the substrate contacts the clamp ring. Typically, clamp rings also function in wafer capturing or alignment on the support member. Wing members extend downwardly and outwardly from the clamp ring to funnel a substrate into alignment with the clamp ring and the support member. Consequently, vertical and lateral forces are applied to the substrate as the wing members achieve lateral alignment and the clamping portion simultaneously achieves vertical alignment of the substrate, clamp ring and pedestal as the clamp ring settles on the pedestal.

In various processing systems such as CVD, PVD, and etch processes, clamp rings also provide shielding to prevent unconfined material from depositing on the interior surfaces of the chamber. Shield arrangements have been devised to restrict the processing environment to a region adjacent to the surface of the substrate. The shield systems typically include a fixed wall portion which extends between the chamber cover and the position within the chamber where the pedestal is positioned during processing. The fixed wall portion extends around the circumference of the pedestal when the pedestal is positioned for processing, and thus blocks access of the processing environment to the walls and interior components of the chamber.

Presently, clamp ring assemblies for substrate shielding, positioning and clamping require that the substrate be positioned and clamped simultaneously. In the standard clamp ring configuration, the substrate is centered on the support member by the downwardly extending wing members of the clamp ring. These angled wings extending downwardly from the clamp ring capture the substrate and position the substrate laterally while at the same time clamping the substrate to the support member as the support member is moved upward through the clamp ring supported in the chamber. This leaves lateral alignment between the substrate and the support member to the last moment before the substrate is clamped to the support for processing. This places undue stress on the substrate because it is being aligned and clamped at the same time, thereby simultaneously applying forces in both the lateral and the vertical direction.

It would, therefore, be desirable to provide a substrate alignment member to properly align a substrate on a support member using gravity without the need for contact with the clamp ring to provide the alignment, and then secure the substrate in its properly aligned position on the support member with a clamp ring. This way, the substrate is aligned before the clamp ring contacts it. It would also be desirable to prevent contact between the clamp ring and the substrate alignment member and avoid causing shadowing of the substrate. Also, it would be desirable to provide clamp ring alignment pins to align and support the clamp ring over the substrate.

SUMMARY OF THE INVENTION

The present invention provides methods and apparatuses for registering a substrate on a support member, for aligning a shield member over a substrate supported on a support member and securing the substrate to the support member, and for the combination of registering a substrate on a support member and then properly aligning a shield member over the substrate to secure the substrate to the support member.

In one aspect, the present invention is a semiconductor substrate support member comprising a substrate positioning member having an upper portion which is outwardly tapered for open mouth receipt of a substrate, and at least one vertically disposed clamp ring alignment member on the circular perimeter of the support member. The substrate positioning member preferably aligns the substrate to the support member with minimal contact between the substrate alignment member and the substrate before the substrate is clamped to the support member. The clamp ring alignment member positions the clamp ring over the substrate support member in proper alignment with the substrate following receipt of the substrate on the substrate receiving surface of the support member. The clamp ring is then contacted with the substrate and the support member.

In another aspect of the present invention, a semiconductor substrate deposition chamber is provided which comprises an enclosure having a support member and a clamp ring disposed within the enclosure.

In another aspect of the invention, at least one vertically disposed clamp ring alignment member is positioned on the circular perimeter of the support member to align the clamp ring both in the lateral and vertical dimensions. A clamp ring comprising a rigid body including a vertical recess for engagement with the clamp ring alignment member and an inner seat surface for receiving and engaging a peripheral portion of the semiconductor substrate, is positioned on the substrate and support member when the clamp ring, substrate and support member are aligned for processing.

In still another aspect of the invention, a method for capturing a semiconductor substrate is provided comprising the steps of providing a substrate support member having a substrate alignment member and at least one clamp ring alignment member extending from the support member, introducing a substrate into a chamber, aligning the substrate on the substrate support member by moving the support member through the substrate so that a misaligned substrate contacts the substrate alignment member and shifts the substrate into alignment with the support member under gravity feed, and subsequently moving the support member through a clamp ring so that the clamp ring alignment member aligns the clamp ring over the support member and substrate positioned on the support member and clamps the substrate in a proper processing position. Preferably, the support member includes pins projecting therefrom on which the substrate is received, and which are positioned such that upon receipt of the clamp ring on the substrate any warp in the substrate is removed and a planar substrate profile is presented to the processing environment.

BRIEF DESCRIPTION OF THE DRAWINGS

These and other aspects, features and advantages of the present invention will be apparent to those of skill in the art from a review of the following detailed description along with the accompanying drawing figures.

The appended drawings illustrate only presently preferred embodiments of this invention and are therefore not to be considered limiting of its scope, for the invention may admit to other equally effective embodiments.

DESCRIPTION OF A PREFERRED EMBODIMENT

Figure 1:
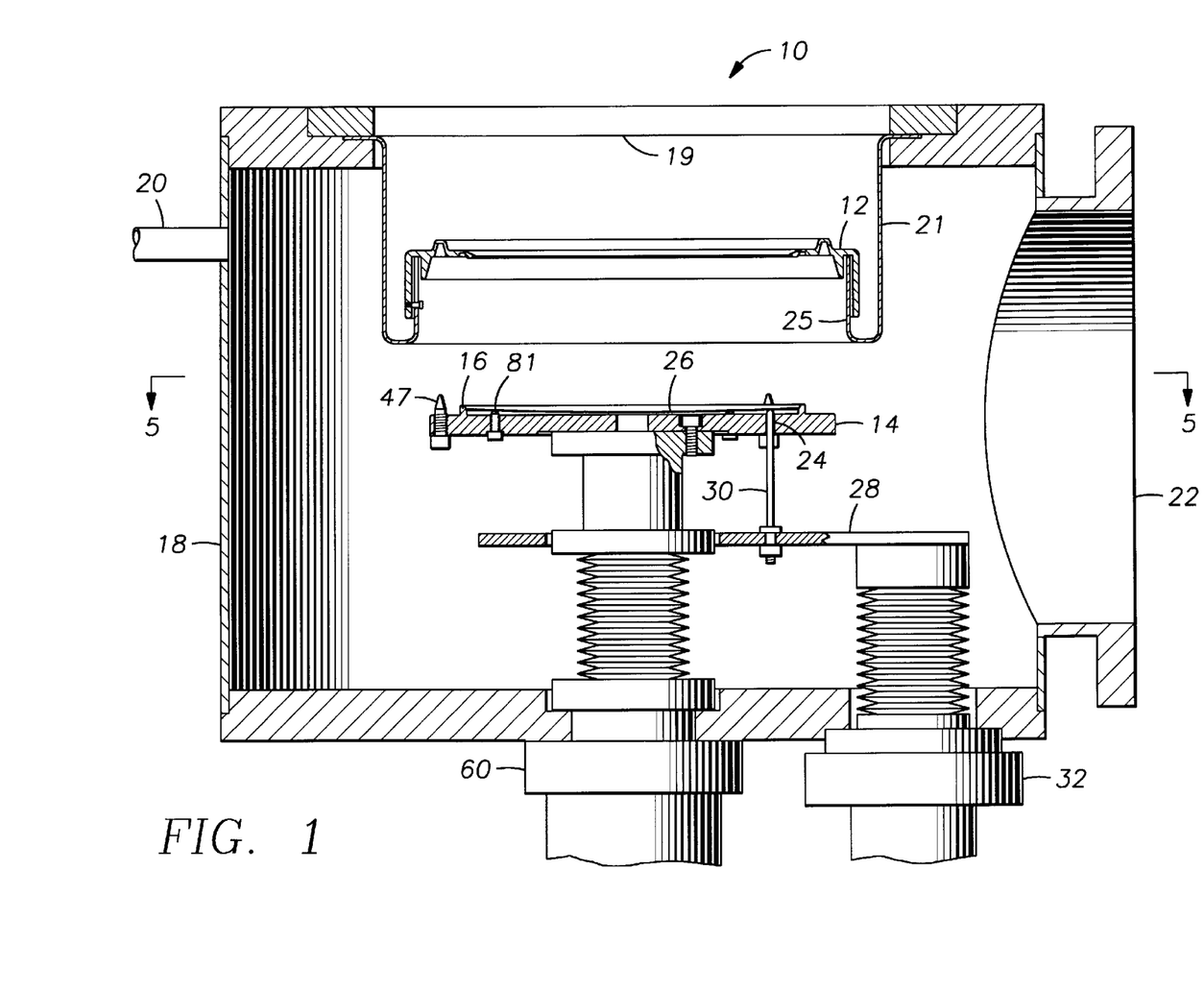
FIG. 1 is a sectional view of a deposition chamber (without a target and cover assembly) showing the arrangement of the clamp ring and the substrate alignment member on the support member in a deposition chamber wherein the support member is positioned below the clamp ring.

As shown in FIG. 1, the present invention relates to a method and apparatus for aligning and flattening a substrate. The apparatus includes a support member 14 disposed in a deposition chamber 10, a substrate alignment member 16 located on the support member 14, at least one clamp ring alignment member 47, and a clamp ring 12. The substrate alignment member 16 aligns a substrate 26 with the support member 14 under gravity feed as the substrate is received on the support member 14. The clamp ring alignment member 47 aligns and locates the clamp ring 12 over the substrate previously aligned with the support member.

For clarity, the substrate alignment member, the clamp ring and clamp ring alignment member, and the combination of the two in operation will be described below.

The Substrate Alignment Member

Referring to FIG. 1, a typical deposition chamber 10 is shown in which the support member 14 having the substrate capturing feature 16, is positioned below a clamp ring 12. There is shown, in partial cutaway, a substrate deposition chamber 10 within which the present invention may be used to advantage.

Alignment pins 47 are positioned on the perimeter of the support member 14 and extend upwardly towards the clamp ring 12 from the substrate receiving surface of the support member 14 to align and support the clamp ring 12 in proper lateral and vertical alignment over the substrate 26. The outward location of the alignment pins 47 relative to the substrate edge reduces the incidence of shadowing which might otherwise be caused by the portion of the clamp ring which receives the alignment pins 47.

The alignment pins 47 are adjustable, preferably being threaded for easy manipulation of their extension from the upper surface of the support member. This enables the clamping assembly to locate the uppermost surface of the substrate, i.e., the surface furthest from the substrate, at the same position relative to the support member irrespective of the nominal thickness of the substrate, where substrates of different nominal thicknesses may be processed on the same substrate support member 14.

Referring now to FIGS. 2 through 5, there is shown in detail the preferred embodiment of the alignment member 16 for aligning the substrate 26 on the support member 14 where the substrate 26 is misaligned with respect to the support member 14 as the substrate 26 is positioned on the support member 14. The alignment member 16 is an annular member, having a base 27, a planar upper surface 28, an outer cylindrical surface 31 and an inner cylindrical surface 32. Uniquely, the inner cylindrical surface 32 includes a tapered alignment portion 34 extending radially inwardly from the upper surface 28. The alignment portion 34 intersects approximately midway between the base 27 and the upper surface 28 in a circular alignment ridge 36. The alignment ridge 36 creates a circular restriction sized to have a diameter slightly greater than the maximum diameter of the substrate 26, within acceptable substrate diameter tolerances. The alignment ridge 36 is positioned, with respect to the edge of the support member 14, to ensure that the edge of the substrate 26 is aligned with the edge of the substrate receiving surface 38 of the support member 14 to center the substrate 26 on the support member 14.

To enable centering of the substrate 26 on the support member 14, the alignment member 16 is positioned on the substrate support member 14 about the perimeter of the substrate receiving surface 38 of the support member 14. As the support member 14 is moved upwardly in the chamber and the substrate 26 is lowered on pins 30 into the alignment member 16, the substrate edge 24, if misaligned, contacts the alignment portion 34 of the alignment member 16. Because the alignment member 16 is fixed with respect to the support member 14, further movement of the pins 30 into the support member 14 will cause the substrate 26 to move radially inwardly, i.e., to a radially centered position, as it slides along the alignment portion 34 under gravity feed to become centered on the support member 14. The substrate 26, when misaligned, will continue to move radially inwardly as it is lowered onto the support member 14 until it passes the circular alignment ridge 36. Once the substrate 26 has moved below the alignment ridge 36, the substrate edge 24 is located adjacent to the inner cylindrical face 32 of the alignment member 16. Referring now to FIGS. 2 through 5, the cross-section of alignment portion 34 preferably has a beveled alignment portion 34 extending downwardly, and radially inwardly, from the upper surface 28 to the alignment ridge 36 to provide a frustoconical-shaped open mouth for receipt of a substrate. Thus, the frustoconical surface comprising the alignment portion 34 is inwardly tapered, i.e., it decreases in diameter as the distance from the upper surface 28 to a point on the alignment portion 34 increases.

Figure 5:
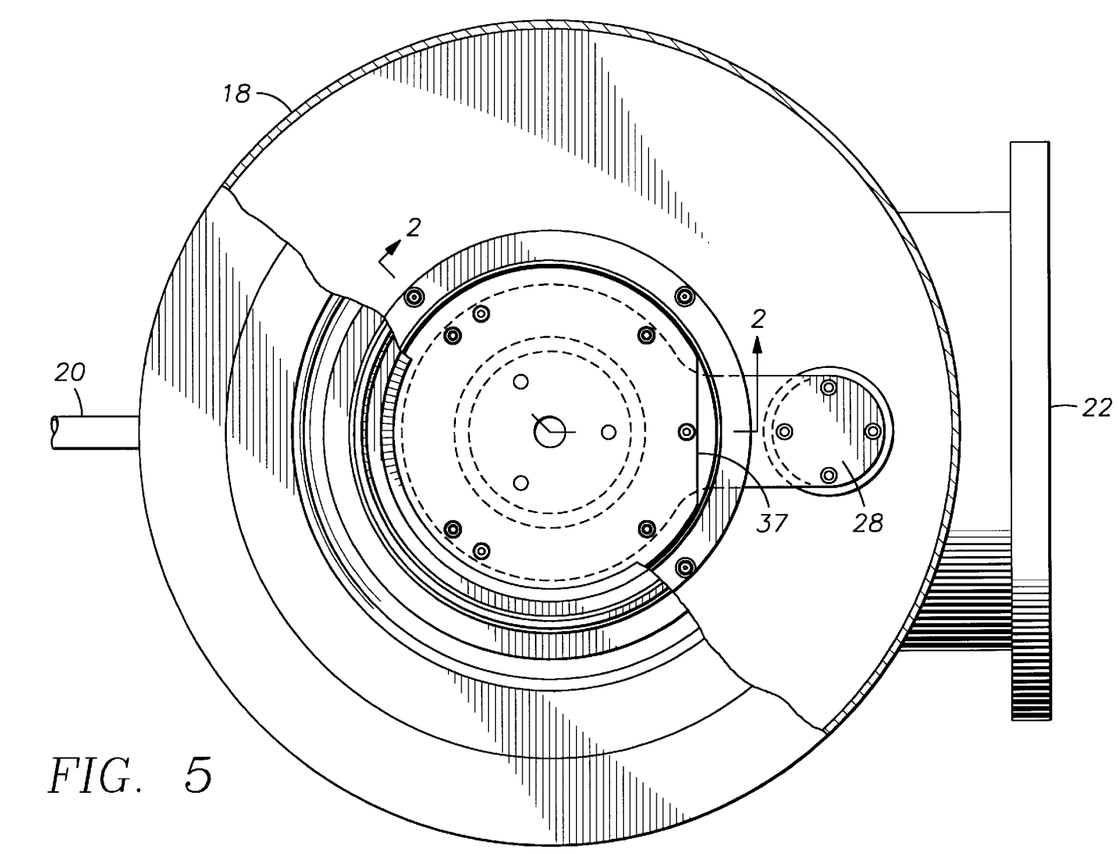
FIG. 5 is a top view of the substrate support showing an alignment feature of the apparatus.

In an alternative embodiment, the annular alignment member may include a wafer flat alignment surface 37 (shown in FIG. 5). The wafer flat alignment surface 37 aligns the flat portion of the wafer (used for wafer identification). in much the same manner as the annular substrate alignment member 16. The alignment portion 34 of the alignment member 16 having the wafer flat alignment surface 37 tapers inwardly and downwardly to a ridge formed between the upper surface 28 and the base 27. As a substrate having a wafer flat is received into the alignment member 16, the substrate rotates into alignment under gravity feed and slight vibratory movement resulting from the operation of the chamber until the wafer flat is aligned with the wafer flat portion of the alignment member.

Referring still to FIGS. 2 through 5, the alignment member 16 also provides alignment of the substrate 26 on the support member 14 without substantial risk that the substrate 26 will become adhered to the upper surface of the support member 14 while it is also in contact with the alignment member 16. The sequence of steps involved in aligning and securing the substrate in the processing position ensures that this does not occur, because the alignment member 16 properly aligns the substrate 26 before the support member 14 and the substrate 26 lift the clamp ring 12 off the hanger 21. As discussed above, the substrate 26 may be warped, or the pins 30 may not position the underside of the substrate 26 parallel to the substrate receiving surface 38 of the support member 14 as the substrate is being lowered onto the support member 14. Therefore, a portion of the substrate 26 may be closer to the support member than other portions of the substrate. The inner diameter of the alignment member 16, defined by the inner cylindrical wall 32, is sized slightly larger than the substrate 26 to ensure that the substrate is properly aligned on the support member 14. To provide this result, the proper height of the alignment ridge 36 is determined by calculating, from the warpage tolerance of the substrate, the alignment member spacing, the tolerance on the alignment ridge height and the positioning of the alignment member, the maximum possible distance differential between the point on the underside of the substrate 26 which will first contact the upper surface of the support member 14 and the point on the substrate farthest from that point measured along a path perpendicular to the support member surface, and sizing the height of the alignment ridge 36 greater than this distance.

If the substrate is dished, i.e., if it has a bowed convex or concave surface, the edge of the substrate 26 will move radially outwardly as the clamp ring 12 pushes the entire surface of the substrate 26 into contact with the upper surface of the support member 14. This may cause the edge of the substrate 26 to move radially outwardly as it is clamped. Typically, where the substrate 26 is dished, the substrate edge 24 will move through an arc, centered on the point of initial contact between the substrate and the support member 14, such that the closer the edge gets to the support member 14, the greater the radial extension of the edge. By providing the inner cylindrical wall 32 with a diameter slightly larger than the substrate 26, the substrate is centered on the substrate support member 14 by the inner cylindrical wall 32.

Figure 9:
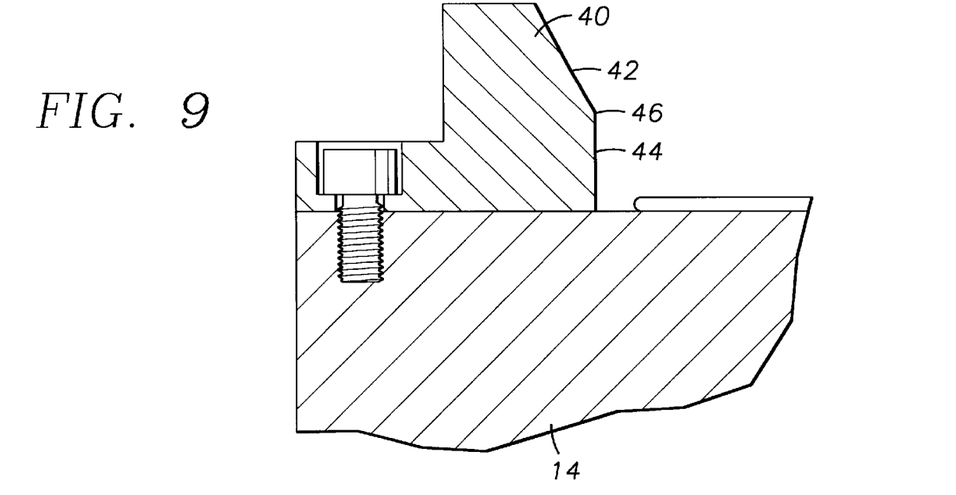
FIG. 9 is a sectional view of the apparatus of FIG. 1, showing an alternative embodiment of the alignment member.
Figure 10:
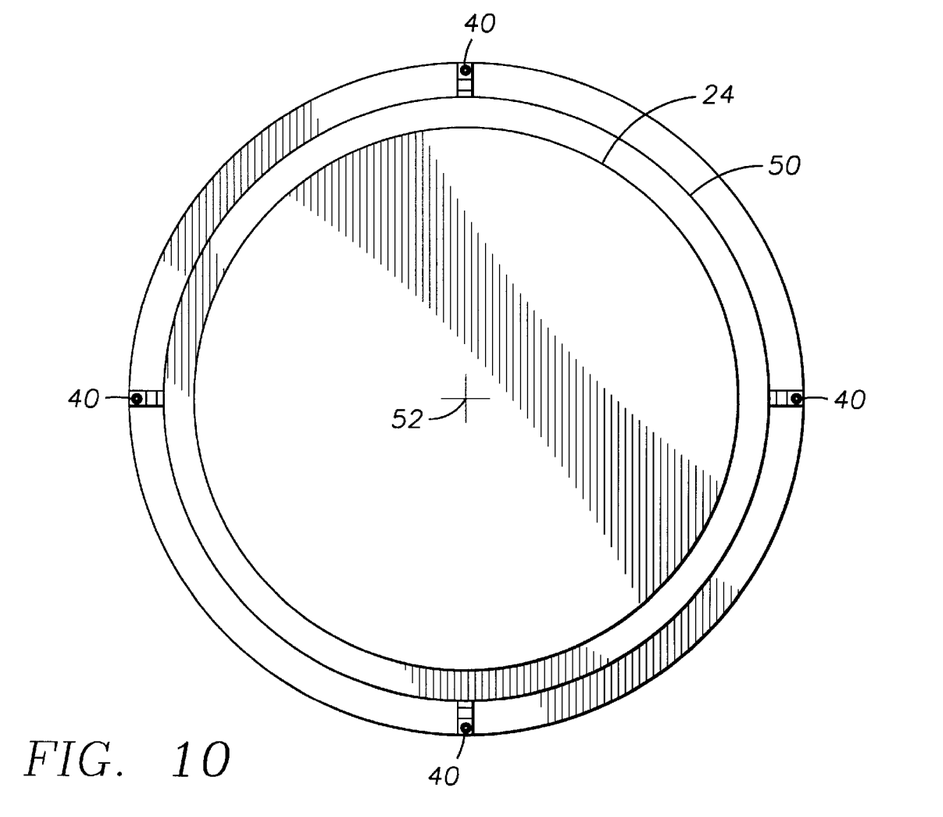
FIG. 10 is a top view showing the alternative embodiment of FIG. 9.

To provide the alignment features of the present invention, without substantially affecting the uniformity of the deposition or etch process, the alignment surface for aligning the substrate to the support member 14 may be provided on a plurality of indexing posts 40, preferably four to six, placed about the perimeter of the upper surface of the support member 14 as shown in FIGS. 9 and 10. Each of the posts 40 include an upper, inwardly tapered surface 42, a lower surface 44, and an alignment ridge 46 provided at the confluence of the upper and lower surfaces 42, 44. The posts 40 are placed about the perimeter of the support member 14, such that the center of the alignment ridges 46 are tangent to, and positioned on, a circle 50 centered about the center 52 of the circular support member. The circle 50 has a diameter slightly larger than the maximum, within tolerance, diameter of a substrate 26. The upper tapered surface preferably has the same taper, and relative size, as the alignment portion 34 of the alignment member 16. Likewise, the ridge 46 is preferably located the same distance from the upper surface of the support member as the alignment ridge 36 of the alignment member 16. Thus, the alignment posts 40 will center a substrate 26 on the support member 14 without significant contact between the substrate and the support member.

Although the alignment members have been described herein as being received on the support member 14, it is specifically contemplated that the alignment member 16 may be spaced from the support member 14, or may be positioned above the support member 14 on pins or other supports, such that the substrate is not surrounded by the alignment member 16 as it is received on the support member. Alternatively, where the alignment member 16 is spaced from the support member 14 to ensure that the substrate is not contacting the alignment member 16 as it engages the substrate receiving surface 38, the alignment member 16 may be moved after the substrate is deposited on the support member, and repositioned over the support member after the substrate is removed from the support member. This ensures that the alignment member will not shadow, or otherwise impose, non-uniformities on the substrate 26.

The substrate alignment member 16 of the present invention provides a simple means of repeatably aligning substrates on a support member 14, and may be used in preexisting substrate processing chambers with minimal affect on the existing process chamber parameters. Additionally, it has universal application wherever a substrate must be aligned for processing, particularly in applications where the potential for misalignment between the substrate and the substrate handling equipment exists.

The Clamp Ring and Clamp Ring Alignment Pins

Figure 6:
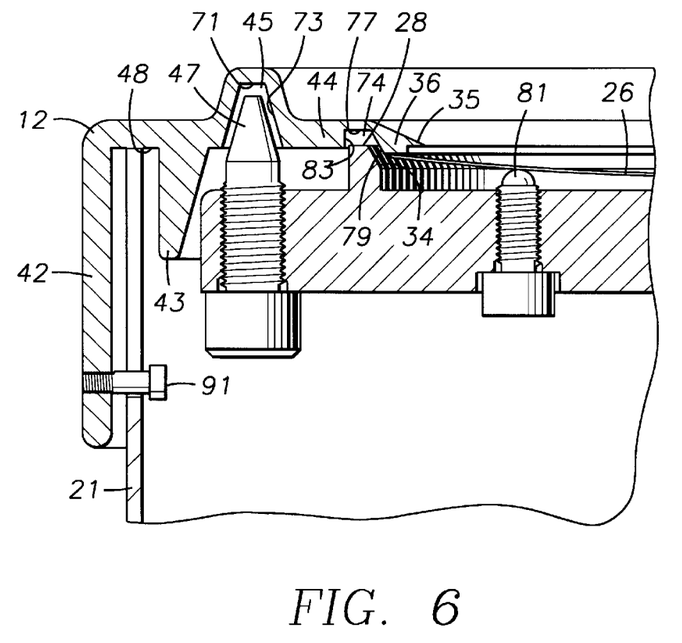
FIG. 6 is a partial sectional view of the clamp ring of the present invention showing contact of the clamp ring with a warped substrate.
Figure 7:
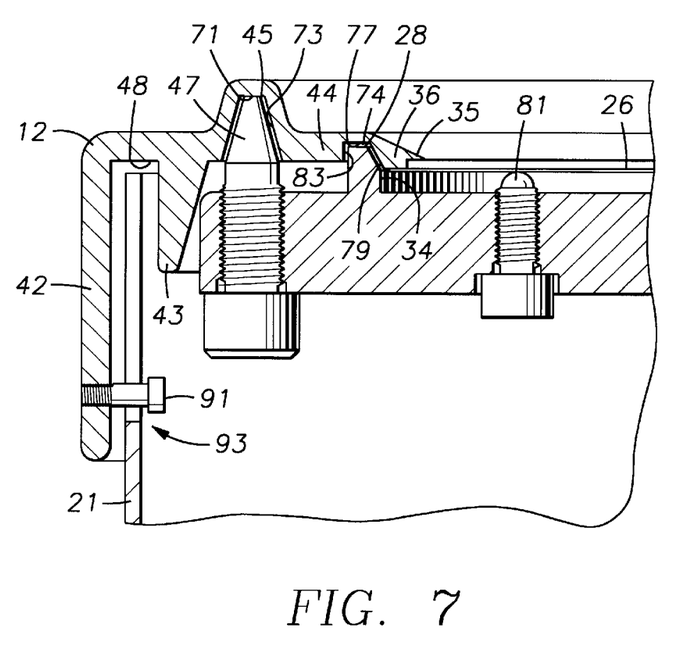
FIG. 7 is a partial sectional view of the clamp ring of the present invention showing the substrate clamped on the support member.

Referring now to FIGS. 6 and 7, the preferred embodiment of the clamp ring 12 and rest buttons 81, and their relative positioning to provide clamping of the substrate, are shown. This positioning enables the clamp ring 12 to be received over the substrate 26 and ensures a planar surface is presented by the substrate for processing. To provide this, the clamp ring 12, includes an annular, downwardly extending, outer flange 42 from which an annular, horizontal roof 44 extends radially inward. The ring 12 further includes a downwardly projecting wing member 43, a downwardly projecting inner annular base 36, and a lip 35 extending radially inward of the base 36 to overhang the outer edge of a substrate 26. The inner annular base 36 and overhanging lip 35 are located at the inner circumference of the roof 44 and extend inwardly of the outer edge of the substrate 26.

An outer annular base 48 supports the ring 12 on the shield 21 in the chamber just prior to and following processing of the substrate 26.

Roof 44 defines a plurality of clamp ring alignment recesses 45 extending inwardly of the wing member 43 which receive alignment pins 47 when the clamp ring 12 is received on the support 14. Preferably, four alignment pins 47 are located around the outer perimeter of the support member 14 to position the ring 12 over the support member 14 in lateral and vertical alignment with the support member 14 and substrate 26. The alignment pins 47 are preferably tapered or conical to facilitate alignment of the clamp ring 12 as the clamp ring is lifted off the hanger 21. The clamp ring alignment recesses 45 receive alignment pins 47 when the support member 14 is moved through the clamp ring positioned on the hanger 21. Although FIG. 6 shows only longitudinal sections of the clamp ring 12, all elements of the clamp ring have 3-fold circular symmetry relative to the longitudinal axis of the ring, so the 3-dimensional structure of the clamp ring should be apparent from the Figures.

The clamp ring alignment recesses 45 have an upper base surface 71 and a tapered sidewall 73. The upper base surface 71 of the recess 45 is received on the upper end of the alignment pin 47 to support the clamp ring 12 on the support member 14 during processing and provide predictable and repeatable positioning of the clamp ring 12 surfaces relative to the support member 14. This enables repeatable positioning of the inner annular base 36 of the support 14, thereby enabling the substrate to be clamped. The sidewall 73 of each recess 45 is tapered from a larger diameter at its lower open end to a smaller diameter at its upper base surface 71, to enable lateral and rotational positioning of the clamp ring 12 to the support member 14. Alignment pins 47 are adjustable in height, preferably threaded, to properly space the contact of upper base surface 71 to the top of the pin 47 from the top of the rest buttons 81 (likewise threaded to thereby properly space the top of the rest button), and the inner annular base 36 from the support member 14 to accommodate substrates of different nominal thicknesses. Preferably, the lower face of the inner annular base 36 and the upper surface of the support member 14 define a gap when the clamp ring 12 is received on alignment pins 47 and supported thereon during processing. When a substrate is received in the chamber and supported on the upper surface of the buttons 81 projecting from the support member 14, the gap defined by the lower surface of the inner annular base 36 and the upper surface of the rest buttons is slightly less than the thickness of the substrate being processed, thus allowing the clamp ring to achieve flattening and clamping of the substrate over the rest buttons 81.

The roof 44 also includes an annular substrate alignment member recess 74 wherein the substrate alignment member 16 is recessed during processing. The substrate alignment member recess 74 includes a base surface 77, an inner angled surface 79, and an outer surface 83. In the processing position, when the clamp ring 12 is supported on the alignment pins 47 over the substrate 26 (shown in FIG. 7), the upper surface 28 of the substrate alignment member 16 and the base surface 77 of the substrate alignment member recess 74 define a gap therebetween. Preferably, this gap is on the order of $20/1000$ of an inch. The inner angled surface 79 of the alignment member recess 74 and the inner angled surface 34, as well as the outer surface 83 of the alignment member recess 74 and the outer surface 31 of the alignment member 16, also define a gap therebetween. Preferably, this gap is on the order of $30/1000$ of an inch. The gap existing between the clamp ring 12 and the substrate alignment member 16 prevent contact between the clamp ring and the alignment member, thereby preventing particle generation near the surface of the substrate being processed.

The clamp ring 12 should be heavy enough to flatten a warped substrate and prevent the clamp ring 12 or the substrate 26 from sliding across the surface of the support member 14. The pressure required to prevent the substrate 26 from sliding across the surface of the support member 14 is typically increased in applications where a heat transfer gas is flowed through ports on the top of the support member and thus over the backside of the substrate. In steady state, the pressure on the back side of the substrate is proportional to clamp ring weight divided by the surface area on which the pressure acts on the back side of the substrate. In either case, the base 36 provides transfer of the gravitational force of ring mass, or other applied forces, to the substrate 26 to flatten the substrate and clamp the substrate to the support member 14.

The support member 14 preferably includes rest buttons 81 extending radially from the upper surface of the support member 14 to support the substrate 26 during processing with minimal surface area contact between the substrate and the rest buttons. This is particularly useful in applications where film layers are being deposited on both sides of the substrate. However, other support arrangements could be used to support the substrate on the support member 14, including simply resting the substrate on the support member 14 while enabling flattening of the substrate on the support member 14 with the clamp ring 12. The present invention can be used to advantage in these applications where the substrates are typically handled upside down in the chamber. That is, the previously processed surface of the substrate is received onto the lift pins 30 and then positioned on rest buttons 81 so that in this processing position a film layer can be deposited on the backside of the substrate. Although receipt of the substrate has been described herein as being on the rest buttons 81 above the support member 14, it is specifically contemplated that the substrate may be received on support member 14 to support the substrate.

The clamp ring 12 must be positioned so that the lower surface of the inner annular base 36 is spaced a distance slightly less than the height of the support member 14 plus the thickness of the substrate 26. In other words, the lower surface of the inner annular base 36 must contact the upper surface of the substrate 26 and the support member 14 must contact the lower surface of the substrate 26 when the substrate is positioned therebetween for processing and the inner annular base 36 must exert a slight pressure on the substrate 26 to achieve clamping.

To prevent rotation of the clamp ring 12 before or after processing, a pin 91 is provided on the outer flange 42 of the clamp ring 12 and a mating slot 93 is formed in the hanger 21. As the clamp ring 12 is re-positioned onto the hanger 21, the pin 91 slides into the slot 93 to secure the ring in a fixed position and to align a ring that may have become misaligned due to gentle vibration of the equipment and other similar factors.

Operation of the Alignment Member and the Clamp Ring Within the Chamber

Figure 2:
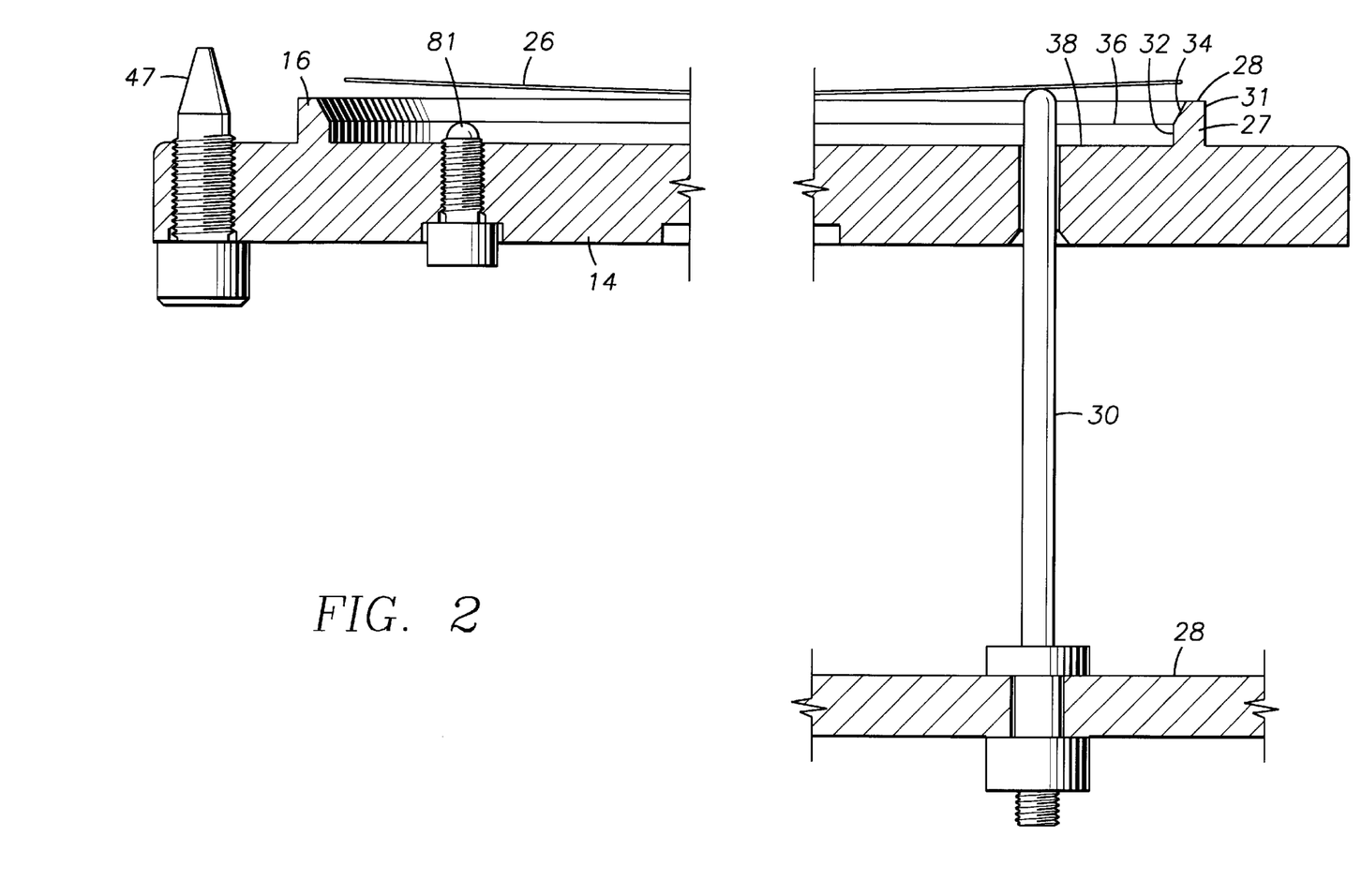
FIG. 2 is a partial sectional view of the apparatus of FIG. 1, showing receipt of a substrate into the alignment member located on the support member.
Figure 3:
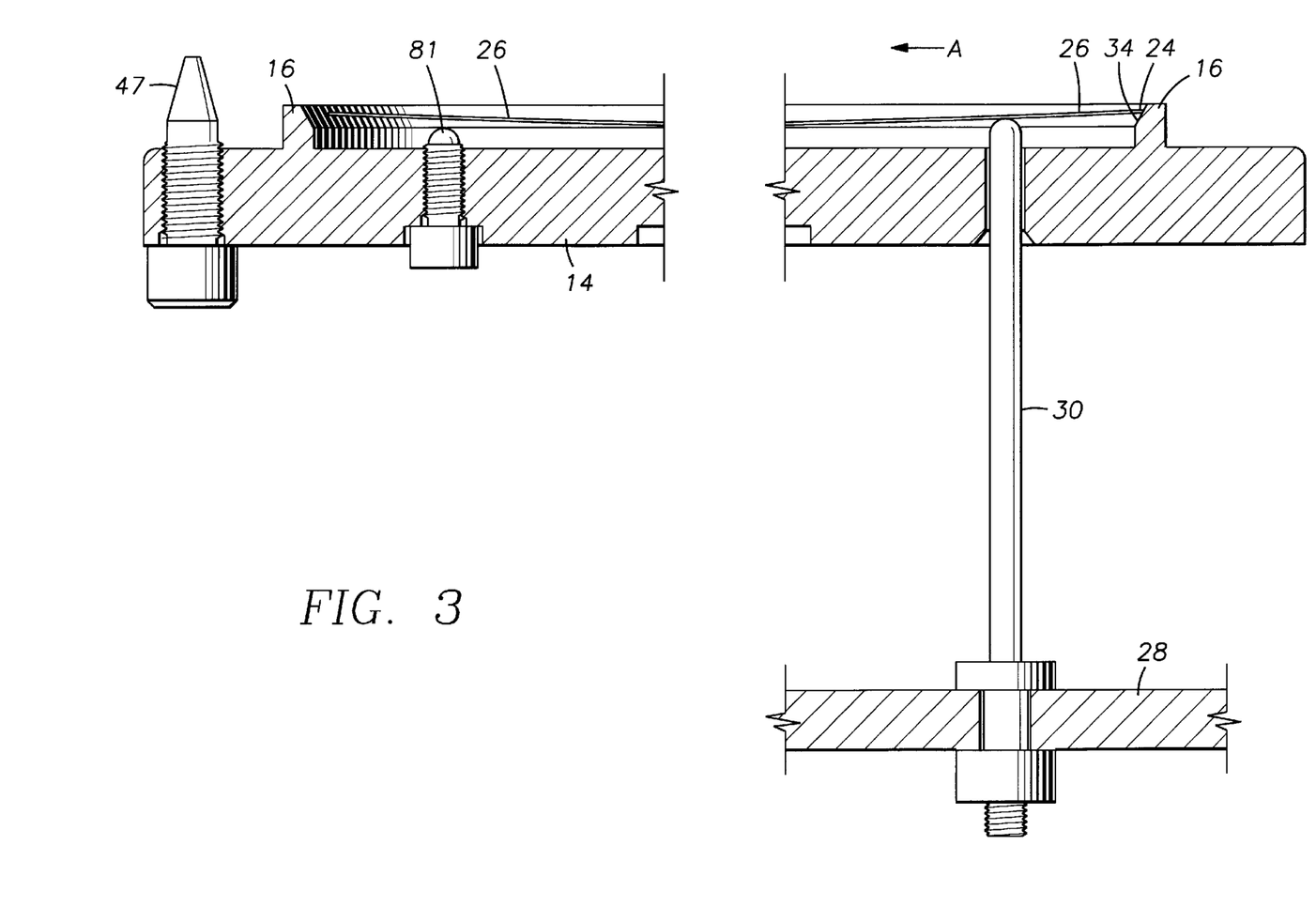
FIG. 3 is a partial sectional view of the apparatus of FIG. 1, showing the substrate in contact with the alignment member.
Figure 4:
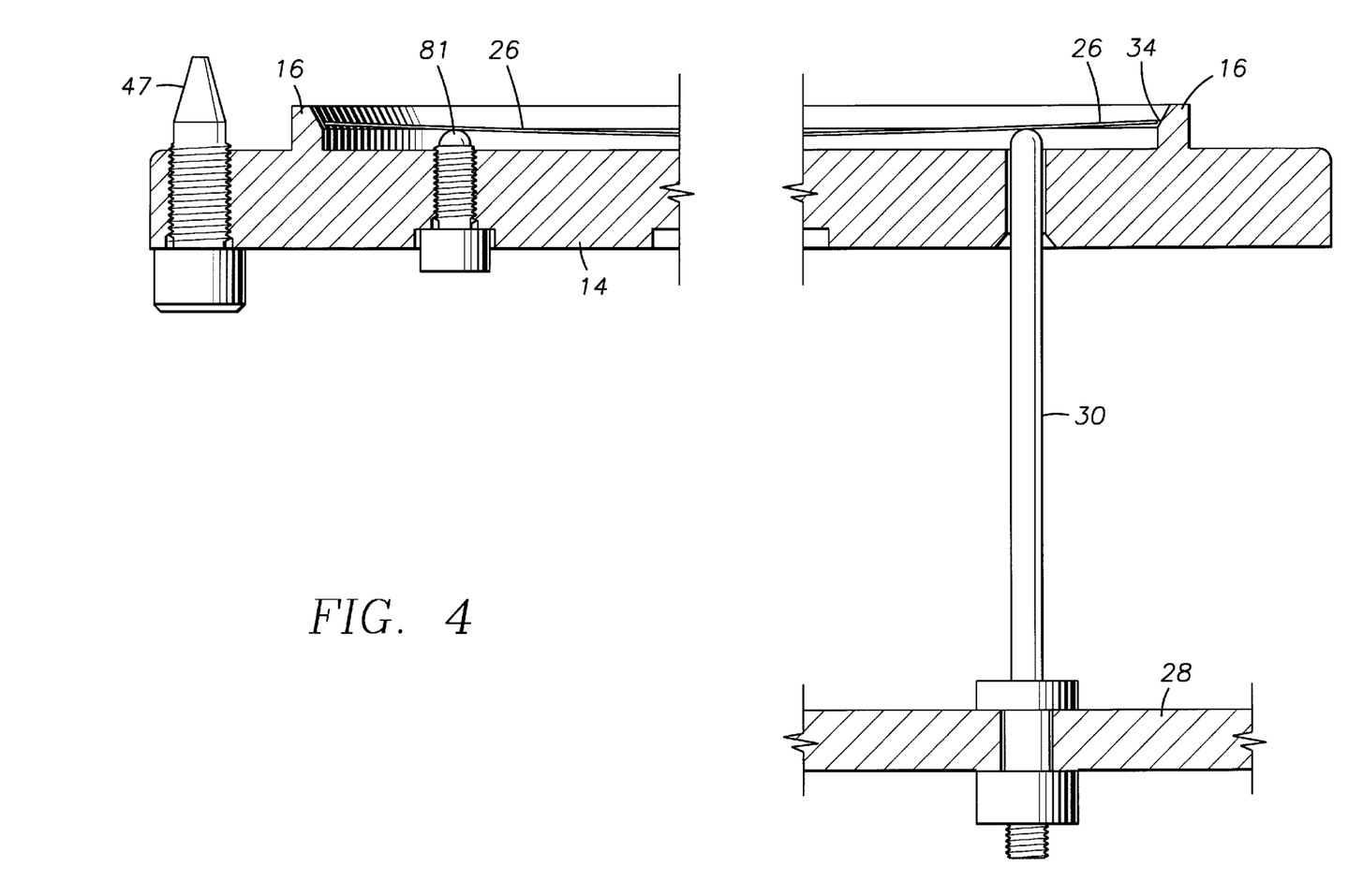
FIG. 4 is a partial sectional view of the apparatus of FIG. 1, showing the substrate received, and centered on, the support member.

Referring now to FIGS. 1 through 8, the sequence of operation to clamp a substrate to a support member is shown. To position the substrate 26 on the support member 14 a robot blade (not shown) positions the substrate 26 above the support member 14. The pins 30 then move upwardly to lift the substrate 26 off the blade. The blade is removed from the chamber 10, and the pins 30 then retract into the support member 14 to position the substrate 26 in the alignment member 16 as shown in FIGS. 2, 3 and 4. As the pins 30 continue to retract, the substrate 26 is positioned on the rest buttons 81 extending from the support member 14 as shown in FIG. 4.

Once the substrate 26 is positioned on the support member 14, as shown in FIG. 4, the support member is elevated through a clamp ring 12 positioned on a hanger 21 within the chamber 10. A gas may be provided to a plurality of channels (not shown) in the support member 14 to enable heat transfer between the support member 14 and the substrate. One such arrangement is disclosed in U.S. Pat. No. 5,228,501, Tepman et al., issued on Jul. 20, 1993, which is hereby incorporated herein by reference.

In preparation for receiving a new substrate 26 into the chamber 10, the support member 14 is lowered by a drive mechanism well below the clamp ring 12 suspended on the shield 21, and so that the bottom of the support member 14 is close to a pin positioning platform 28. The support member 14 includes three or more vertical bores (not shown), each of which contains a vertically slidable pin 30. When the support member 14 is in the lowered position just described, the upper tip of each pin 30 protrudes above the upper surface of the support member 14. The upper tips of the pins 30 define a plane parallel to the upper surface of the support member 14.

A conventional robot arm or blade carries a semiconductor substrate 26 into the chamber 10 and places the substrate 26 above the upper tips of the pins 30. A substrate lift mechanism 32 moves the pins 30 upwardly, to place the upper tips of the pins 30 against the underside of the substrate 26 and additionally lift the substrate 26 off the robot blade. The robot blade then retracts from the chamber 10, and the support lift mechanism 60 raises the support member 14 so that the support member 14 picks up the substrate 26 off the substrate lift pins 30. At this time, the pins will be resting in the platform's counter-bores. As the support member 14 is elevated in the chamber 10, the alignment surface 34 of the alignment member 16 interferes with the outer edge of a misaligned substrate 26 (shown in FIG. 3) and urges the substrate 26 under gravity feed towards a centered position on the support member 14 along arrow A.

Figure 8:
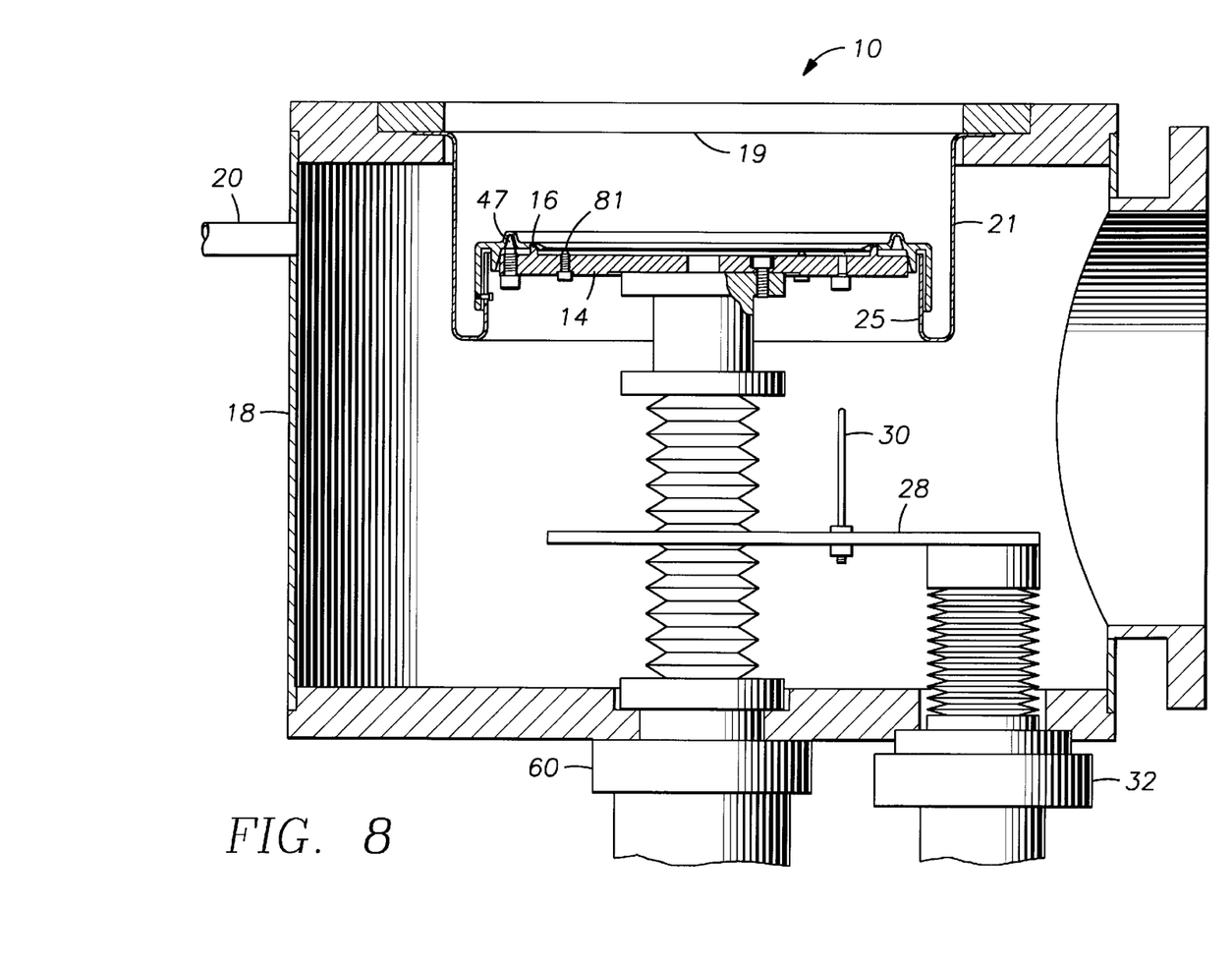
FIG. 8 is a sectional view of a deposition chamber showing the arrangement of the clamp ring and the support member having the substrate capturing feature in a deposition chamber wherein the support member is positioned through the clamp ring.

As the support member 14 continues moving upward, the support member 14 passes into the clamp ring 12. As the support member 14 continues moving upwardly, the alignment pins 47 projecting from the support member 14 contact the clamp ring 12 within recesses 45. The outer edge of a warped substrate 26, which will be extending upwardly from the surface of the support member 14 by a greater distance than other portions of the substrate, contacts the inner annular base 36 of the clamp ring 12 as the support member 14 is moved through the clamp ring 12. The weight of the clamp ring 12 flattens the substrate to present a generally planar surface for receipt of deposition material thereon. The height of the alignment pins 47 determines the degree to which substrate warpage is affected or cured. The alignment pins 47 are preferably positioned and sized to ensure that the inner annular base 36, i.e., the portion of the clamp ring which actually contacts the substrate when the ring 12 is received on the alignment pins 47, is spaced from the portion of the support member 14 on which the substrate rests by a distance slightly less than the thickness of the substrate 26, thus enabling the clamp ring 12 to flatten the substrate and thereby present a generally planar substrate surface for processing. If the clamp ring supporting surfaces of the alignment pins 47 are positioned too low with respect to the location of the substrate on the rest buttons 81 of the support member 14, the outer edge of the substrate 26 will be bowed downwardly, thus presenting a convex upper substrate surface and unnecessarily placing stresses on the substrate. If alignment pins 47 are positioned too high, the warped edges of a substrate 26 will not be flattened, thereby allowing a convex upper substrate surface of a warped substrate to be presented while allowing a substrate to vibrate out of proper alignment. When the pins 47 are properly sized and positioned with respect to the substrate receiving surface of the support member in the preferred embodiment, i.e., the uppermost extension of buttons 81, the positions of the described components are as shown in FIG. 8.

At this point, a substrate process, such as film deposition or etching, can begin. In the case of the exemplary sputtering chamber 10 shown in FIG. 8, a sputtering process gas (typically argon) is supplied to the chamber through the gas inlet 20, and a DC power supply (not shown) applies a negative voltage to the sputtering target 19. The voltage excites the argon gas into a plasma state, and argon ions bombard the negatively biased target 19 to sputter material off the target 19. The sputtered material then deposits on the substrate 26, except for the periphery thereof which is shielded by the clamp ring 12.

After the film layer has been deposited on the substrate 26, the substrate 26 is removed from the chamber 10 by reversing the sequence of steps by which it was carried into and positioned within the chamber 10.

It is specifically contemplated that the present invention is useful for various types of semiconductor processes and processing devices, such as a physical vapor deposition (PVD) chamber, a chemical vapor deposition (CVD) chamber for depositing a conductor, semiconductor or dielectric film on a substrate, a plasma etch chamber, or any other process and apparatus requiring that an object be positioned and secured in the achieved position.

While the foregoing is directed to the preferred embodiment of the present invention, other and further embodiments of the invention may be devised without departing from the basic scope thereof. The scope of the invention is determined by the claims which follow.

We claim:

1. An apparatus for aligning and clamping a substrate on a support member, comprising:
   a) a substrate support member having a substrate receiving surface, a substrate positioning member and at least one clamp ring alignment member vertically disposed on the support member, the substrate positioning member having an upper tapered portion; and
   b) a clamp ring having a plurality of vertical recesses for engagement with the clamp ring alignment member of the substrate support member to support the clamp ring in a spaced relationship with the substrate receiving surface and an inner seat surface for receiving and engaging a peripheral portion of the substrate;
   c) wherein the substrate positioning member is annular.

2. The apparatus of claim 1, wherein the substrate positioning member is disposed on the substrate support member adjacent the substrate receiving surface.

3. The apparatus of claim 1, wherein the upper tapered portion of the substrate positioning member is frustoconical.

4. The apparatus of claim 1, wherein the substrate positioning member comprises a plurality of indexing posts disposed on the substrate support member adjacent the substrate receiving surface.

5. The apparatus of claim 1, wherein the upper tapered portion of the substrate positioning member includes an alignment ridge.

6. The apparatus of claim 5, wherein the alignment ridge is spaced from the substrate receiving surface of the substrate support member by a distance which exceeds the maximum height of a substrate warpage.

7. An apparatus for aligning and clamping a substrate on a support member, comprising:
   a) a substrate support member having a substrate receiving surface. a substrate positioning member and at least one clamp ring alignment member vertically disposed on the support member, the substrate positioning member having an upper tapered portion; and
   b) a clamp ring having a plurality of vertical recesses for engagement with the clamp ring alignment member of the substrate support member to support the clamp ring in a spaced relationship with the substrate receiving surface and an inner seat surface for receiving and engaging a peripheral portion of the substrate;
   c) wherein the clamp ring alignment member comprises a plurality of alignment pins having an upper conical portion for mating with the recesses on the clamp ring.

8. The apparatus of claim 7, wherein the clamp ring further comprises a roof having a second recess to receive the substrate positioning member, the second recess being sized and positioned to prevent contact between the substrate positioning member and the clamp ring.

9. The apparatus of claim 7, wherein the clamp ring further comprises a wafer flat portion for aligning a wafer flat.

10. The apparatus of claim 7, wherein the substrate support member further includes a spacing member disposed on the substrate support member to provide an offset distance between the substrate and the substrate support member.

11. The apparatus of claim 7, wherein the alignment pins are vertically adjustable.

12. The apparatus of claim 11, wherein the alignment pins are threaded.

13. The apparatus of claim 7, wherein the clamp ring further comprises a roof extending outwardly of the inner seat surface and generally parallel to the substrate receiving surface, and a lip extending inwardly of the inner seat surface and overhanging a peripheral portion of a substrate positioned on the substrate receiving surface.

14. The apparatus of claim 13, wherein the roof includes at least one clamp ring alignment recess for receipt of the clamp ring alignment member.

15. The apparatus of claim 14, wherein the clamp ring alignment recess is sized and positioned to receive the clamp ring alignment member during processing and to space the clamp ring from the support member and define a gap therebetween.

16. A substrate support member, comprising:
    a) a substrate receiving surface;
    b) at least one clamp ring alignment member vertically disposed on the support member and radially outward of the substrate receiving surface and
    c) a substrate alignment member located outwardly of the substrate receiving surface and having an upper tapered portion. wherein the substrate alignment member is an annular ring.

17. The apparatus of claim 16, wherein the annular ring comprises a frustoconical upper portion for urging a misaligned substrate into alignment over the substrate receiving surface.

18. The apparatus of claim 17, wherein the annular ring includes an inner angled surface which urges a misaligned substrate into a proper alignment over the substrate receiving surface.

19. The apparatus of claim 16, wherein the clamp ring alignment member comprises a plurality of conical alignment pins.

20. The apparatus of claim 19, wherein the alignment pins are located on a peripheral portion of the substrate support member.

21. The apparatus of claim 20, wherein the alignment pins are adjustable.

22. A semiconductor substrate processing chamber having a processing enclosure, comprising:
    a) a support member disposed within the enclosure, the support member having a substrate alignment member, a substrate receiving surface and a plurality of alignment pins positioned on the support member for supporting a clamp ring in a processing position;
    b) a clamp ring located in the chamber, the clamp ring comprising:
       1) an inner annular base adapted for engaging a substrate,
       2) a roof extending outwardly of the inner annular base, and
       3) a lip extending inwardly of the inner annular base and overhanging an annular peripheral region of a substrate received on the substrate receiving surface; and
    c) a spacing member disposed above the substrate receiving surface for providing a gap between a substrate and the support member during processing.

23. The apparatus of claim 22, wherein the substrate alignment member comprises an upper tapered portion.

24. The apparatus of claim 22, wherein the roof includes a plurality of alignment pin recesses to receive the alignment pins.

25. The apparatus of claim 22, wherein the roof includes a substrate alignment member recess to house the substrate alignment member.

26. The apparatus claim 22, wherein said substrate alignment member is annular.

27. The apparatus of claim 22, wherein said substrate alignment member is for aligning an edge of a misaligned substrate on the substrate receiving surface of the support member.

28. The apparatus of claim 22, wherein the spacing member and the clamp ring force a substrate to be substantially planar for processing.

29. The apparatus of claim 22, wherein the substrate alignment member includes an inner cylindrical wall having a tapered alignment face thereon which is contactable with a misaligned substrate as the substrate is positioned on the substrate receiving surface.

30. The apparatus of claim 29, wherein said alignment face is frustoconical.

31. The apparatus of claim 29, wherein said alignment face and said inner cylindrical wall intersect at an alignment ridge.

32. The apparatus of claim 29, wherein the substrate alignment member is disposed on the support member.

33. The apparatus of claim 30, wherein said inner cylindrical face includes an alignment ridge spaced from the substrate receiving surface of the support member by a distance which exceeds the maximum height of any substrate warpage.

* * * * *